United States Patent
Andreoli et al.

(10) Patent No.: US 9,714,963 B2
(45) Date of Patent: Jul. 25, 2017

(54) PRINTER DEVICE POWER CONSUMPTION PROFILING AND POWER MANAGEMENT SYSTEMS USING SAME

(71) Applicant: Xerox Corporation, Norwalk, CT (US)

(72) Inventors: Jean-Marc Andreoli, Meylan (FR); Yves Hoppenot, Notre-Dame-de-Mésage (FR)

(73) Assignee: XEROX CORPORATION, Norwalk, CT (US)

( * ) Notice: Subject to any disclaimer, the term of this patent is extended or adjusted under 35 U.S.C. 154(b) by 679 days.

(21) Appl. No.: 14/245,187

(22) Filed: Apr. 4, 2014

(65) Prior Publication Data
US 2015/0285846 A1 Oct. 8, 2015

(51) Int. Cl.
*G01R 21/00* (2006.01)
*G01R 21/06* (2006.01)
(Continued)

(52) U.S. Cl.
CPC ......... *G01R 21/133* (2013.01); *G06F 1/3284* (2013.01); *G06F 3/1221* (2013.01);
(Continued)

(58) Field of Classification Search
CPC ........ G05B 15/02; G05B 13/02; G05B 19/02; H04L 67/10; H04L 67/12; H04L 12/2803;
(Continued)

(56) References Cited

U.S. PATENT DOCUMENTS

2002/0178387 A1 11/2002 Theron
2010/0312600 A1* 12/2010 Motoyama ............ G06F 3/1218
                                                         705/7.35
(Continued)

FOREIGN PATENT DOCUMENTS

CN        102 004 679 A        4/2011

OTHER PUBLICATIONS

Dewar, et al.; "Inference in Hidden Markov Models with Explicit State Duration Distributions", IEEE Signal Processing Letters, 19(4), Mar. 2, 2012, pp. 235-238.
(Continued)

*Primary Examiner* — Roy Y Yi
(74) *Attorney, Agent, or Firm* — Fay Sharpe LLP

(57) ABSTRACT

A power meter generates a time series of observations of power drawn by a device configured to operate in an active mode and to transition through a sequence of inactive modes comprising one or more intermediate inactive modes each having a bounded time duration terminating in a final inactive mode of unbounded time duration, and further configured to transition from any of the inactive modes to the active mode in response to a device activation signal. An electronic data processing device is programmed to determine statistical characteristics of the power draw of the device in each of the inactive modes by fitting a state model to the time series of observations. The state model represents each intermediate inactive mode including its bounded time duration and further includes a probabilistic representation of the transition from any of the inactive modes to the active mode in response to a device activation signal.

13 Claims, 9 Drawing Sheets

(51) Int. Cl.
   *G01R 21/133*   (2006.01)
   *G06F 3/12*   (2006.01)
   *G06F 1/32*   (2006.01)
(52) U.S. Cl.
   CPC ........ *G06F 3/1229* (2013.01); *Y02B 60/1267* (2013.01); *Y02B 60/1271* (2013.01)
(58) Field of Classification Search
   CPC ............... H04L 12/2809; H04L 12/281; H04L 12/2818; H04L 12/2825; H04L 29/1249; H04L 41/024; H04L 43/065; H04L 43/10
   See application file for complete search history.

(56) References Cited

U.S. PATENT DOCUMENTS

| | | |
|---|---|---|
| 2011/0010571 A1 | 1/2011 | Dance et al. |
| 2011/0231026 A1 | 9/2011 | Yaoyama |
| 2011/0252248 A1* | 10/2011 | Cameron ............... G06Q 10/04 713/300 |

OTHER PUBLICATIONS

Levinson; "Continuously Variable Duration Hidden Markov Models for Speech Analysis", Computer Speech and Language, 1(1), 1986, pp. 1241-1244.
Mitchell, et al.; "On the Complexity of Explicit Duration HMM's", IEEE Transactions on Speech and Audio Processing, vol. 3, No. 3, May 1995, pp. 213-217.
Murphy; "Hidden semi-Markov Models (HSMMs)", Nov. 20, 2002, pp. 1-13.
Yu, et al.; "A hidden semi-Markov model with missing data and multiple observation sequences for mobility tracking", Signal Processing, 83(2) (2003), pp. 235-250.
Yu, et al.; "An Efficient Forward-Backward Algorithm for an Explicit-Duration Hidden Markov Model", IEEE Signal Processing Letters, vol. 10, No. 1, Jan. 2003, pp. 11-14.
European Search Report for EP 15 16 0677, dated Sep. 3, 2015.

* cited by examiner

PRINTER DEVICE POWER CONSUMPTION PROFILING AND POWER MANAGEMENT SYSTEMS USING SAME

BACKGROUND

The following relates to the power consumption monitoring arts, power management arts, and related arts with application to power consumption monitoring and/or power management of devices that are typically left running and that have active and inactive modes, such as printers (including dedicated printers and also multifunction printers with additional capabilities, e.g. document scanning, facsimile transmit/receive, et cetera), scanners, facsimile machines, computers, and so forth.

In a typical office setting, office machines installed on a local area network (LAN, which may be a wired, wireless, or hybrid wired/wireless network) consume substantial electrical power. While some of this power is consumed during active operation (such as printing or document scanning operations), much of this power is consumed while the device is in its inactive mode(s). For example, the marking engine of a printer may include a fuser component that melts and fuses toner onto paper. The fuser operates at a high temperature, e.g. around 150° C. in some cases. To balance efficiency in terms of print job throughput versus electricity consumption, it is known to configure the device to transition from the active printing mode through one or more inactive mode that typically consume less power with each successively traversed inactive mode, until reaching a final "deepest" sleep mode that usually consumes the least amount of power. These inactive modes reduce power consumption by reducing electrical draw of components in an optimized way. For example, in the first inactive mode, the fuser may be kept at its operating temperature. In the next successive inactive mode the fuser temperature may be reduced to some intermediate value, and in the final inactive mode the fuser temperature may be allowed to fall to room temperature. In this way, the printer is kept "warm" during short periods of inactivity as may typically occur during the workday, and is allowed to go to a minimum power consumption mode if not used for an extended period, such as overnight. Other office devices such as scanners, as well as other devices such as computers, similarly are designed to have an active mode and one or more inactive modes in which higher power draw components may be partly or wholly inactivated or other measures taken to reduce power consumption. In some devices, the duration of each inactive mode in the sequence may be configurable to optimize power use. The various inactive modes may be variously named, e.g. "idle mode", "sleep mode", "power saving mode", "stand-by", et cetera, and if the device goes through a sequence of inactive modes each individual inactive mode may be differently named.

In a typical office setting, there may be a large number of office devices, and these devices are typically inactive most of the time, even during the workday. Optimizing the inactive modes of these devices thus presents an opportunity to improve office energy efficiency (whether a commercial office or a home office). This can be done manually if the inactive mode transition times are user-configurable parameters. Automated algorithms are also known for optimizing inactive mode transition times. See, e.g. Dance et al., U.S. Pub. No. 2011/0010571 A1 published Jan. 13, 2011.

BRIEF DESCRIPTION

In some embodiments disclosed herein, a system includes a power meter and an electronic data processing device. The power meter is configured to measure power drawn by a device. That device is configured to operate in an active mode and to transition through a sequence of inactive modes comprising one or more intermediate inactive modes each having a bounded time duration terminating in a final inactive mode of unbounded time duration wherein the device is further configured to transition from any of the inactive modes to the active mode in response to a device activation signal. The electronic data processing device is configured to determine statistical characteristics of the power draw of the device in each of the inactive modes by fitting a state model to a time series of observations of the power draw of the device acquired using the power meter. In some embodiments the state model comprises states representing the active mode, the one or more intermediate inactive modes including their respective bounded time durations, and the final inactive mode and wherein the fitting includes estimating the power draw parameters of the states representing the active and inactive modes. In some embodiments the state model further includes a probabilistic representation of the transition from any of the inactive modes to the active mode in response to a device activation signal. For example, the state model may update at an update time interval, and the probabilistic representation of the transition from any of the inactive modes to the active mode in response to a device activation signal suitably comprises a probability of transition to the active mode per update time interval. In some embodiments the state model represents the active mode by an active state and represents each intermediate inactive mode by a Markov chain of states of length effective to represent the bounded time duration of the intermediate inactive mode. In this approach, the states of the Markov chain of states representing an intermediate inactive mode have the same values for the power draw parameters. In such a framework, the fitting may further include estimating the bounded time durations of the intermediate inactive modes by estimating the lengths of the Markov chains of states representing the intermediate inactive modes. In some embodiments the power meter comprises a clamp-on ammeter operative coupled with an electrical power cord of the device. In some embodiments the power meter is configured to measure power drawn by a printer.

In some embodiments disclosed herein, a non-transitory storage medium stores instructions readable and executable by an electronic data processing device to perform a method operating on a time series of observations of electrical power draw of a device. That device is configured to operate in an active mode and to transition through a sequence of inactive modes comprising one or more intermediate inactive modes each having a bounded time duration terminating in a final inactive mode of unbounded time duration, and is further configured to transition from any of the inactive modes to the active mode in response to a device activation signal. The method performed by the electronic data processing device executing the instructions stored on the non-transitory storage medium comprises determining statistical characteristics of the power draw of the device in each of the inactive modes by fitting a state model to the time series of observations, wherein the state model comprises a state representing the active mode and a Markov chain of states representing the sequence of inactive modes. In some embodiments, the state representing the active mode has a transition to itself and a transition to the first state of the Markov chain of states, each state of the Markov chain except the last state has a transition to the next state of the Markov chain of states and a transition to the active state, and the last state of the Markov chain has a transition to itself and a transition to the active state. The fitting may suitably include estimating power draw parameters of the states representing the active and inactive modes to fit the state model to the time series of observations. In some embodiments the transition from the state representing the active mode to itself has a transition probability $\eta$, and the transition from the state representing the active mode to the first state of the Markov chain of states has a transition probability $1-\eta$, and the transition from each state of the Markov chain except the last state to the next state of the Markov chain of states has a transition probability $1-\zeta$, and the transition from the last state of the Markov chain to itself has a transition probability $1-\zeta$, and the transition from each state of the Markov chain to the active state has a transition probability $\zeta$, and the fitting further includes estimating $\zeta$ and $\eta$ to fit the state model to the time series of observations. In some embodiments each intermediate active mode is represented by a sub-chain of the Markov chain of states, the states of the sub-chain having the same power draw parameter values. In some embodiments the fitting further includes estimating the bounded time durations of the intermediate inactive modes by estimating allocation of the states of the Markov chain of states to the one or more sub-chains representing the respective one or more intermediate active modes in order to fit the state model to the time series of observations.

In some embodiments disclosed herein, a system comprises: a power meter configured to generate a time series of observations of power drawn by a device configured to operate in an active mode and to transition through a sequence of inactive modes comprising one or more intermediate inactive modes each having a bounded time duration terminating in a final inactive mode of unbounded time duration wherein the device is further configured to transition from any of the inactive modes to the active mode in response to a device activation signal; and an electronic data processing device programmed to determine the power draw of the device in each of the inactive modes by fitting a state model to the time series of observations, wherein the state model represents each intermediate inactive mode including its bounded time duration and further includes a probabilistic representation of the transition from any of the inactive modes to the active mode in response to a device activation signal. In some embodiments the state model represents each intermediate inactive mode as a Markov chain whose length represents the bounded time duration of the intermediate inactive mode. In some embodiments the system further comprises a printer configured to operate in an active mode and to transition through a sequence of inactive modes comprising one or more intermediate inactive modes each having a bounded time duration terminating in a final inactive mode of unbounded time duration wherein the device is further configured to transition from any of the inactive modes to the active mode in response to a device activation signal, wherein the power meter is operatively connected to generate a time series of observations of power drawn by the printer.

DETAILED DESCRIPTION

Figure 1:
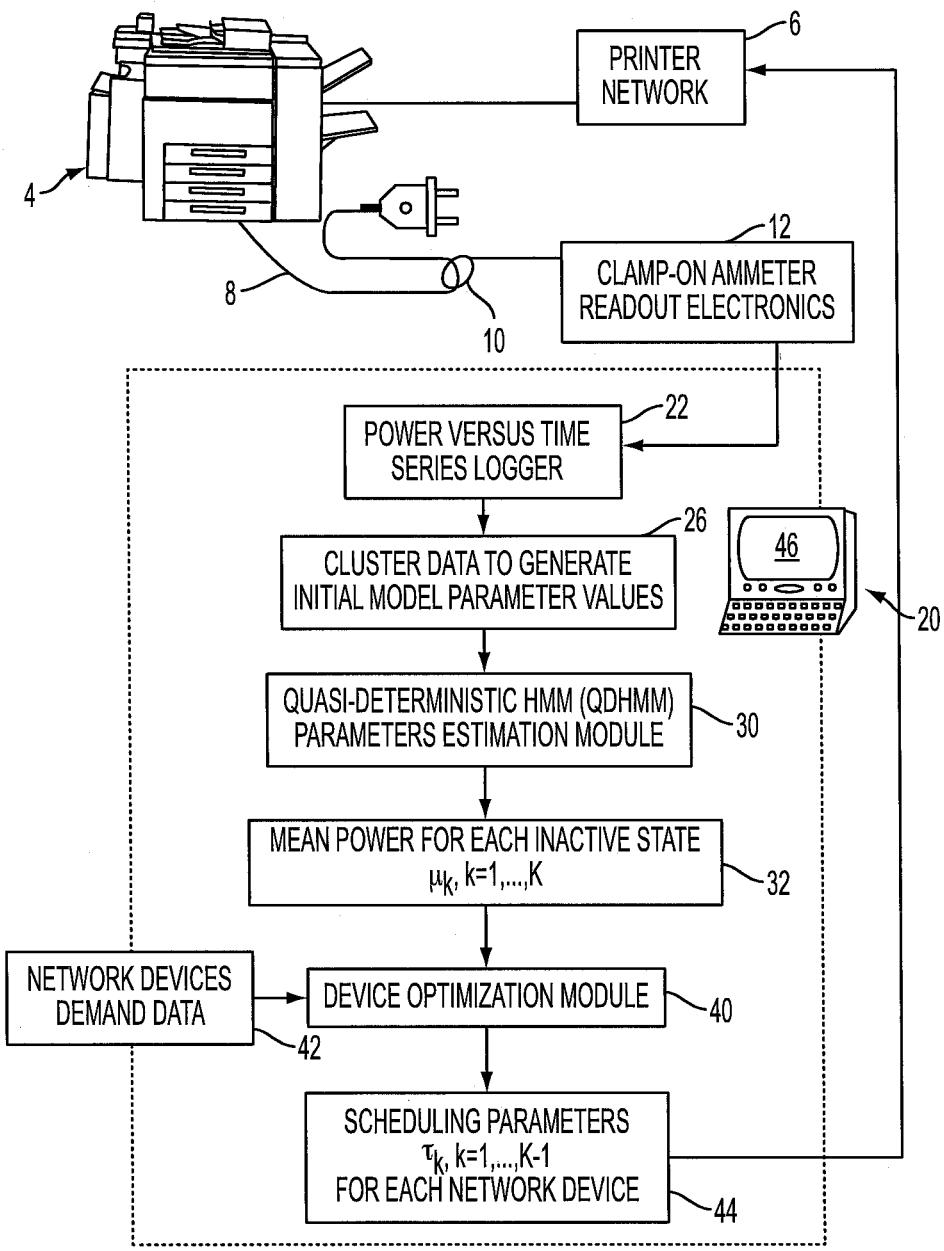
FIG. 1 diagrammatically shows a system for device power consumption profiling.

Accurate knowledge of the statistical characteristics of power consumption in each inactive mode is useful or required information for optimizing the inactive mode transition times. Power consumption ratings for the inactive mode(s) of a commercial device are often provided by the manufacturer. However, the inventors have found that in practice these nominal power consumption ratings are sometimes of limited accuracy, and may not be provided for some devices. Moreover, power consumption in the inactive mode(s) may drift over time as device components age, or may change due to replacement of original equipment manufacturer (OEM) parts with after-market parts, or the power consumption information may become lost for out-of-production device models, or so forth. Additionally, it may be useful for some optimization tasks to collect information on the device demand in the specific environment in which the device is used.

Many office machines are highly automated and include electronic data processors and the like. This is especially true for multifunction printers and other devices providing multiple functions, as an electronic processor is usually provided to select and control the various operating functions. However, these on-board device electronics are usually isolated from the main power supply by a.c.-d.c. converters, power regulating/conditioning electronics, and so forth. Thus, it would be difficult to add accurate power monitoring capabilities to the programmable electronics of a multifunction printer or other office device. Moreover, any power monitoring that implicates the on-board electronics of the device becomes device-specific, and hence needs to be re-created for each different device model or type.

Disclosed herein is a general approach that relies upon monitoring of the device power draw, for example at the power input, e.g. power flowing through the 110 $V_{AC}$ power cable in the case of a typical U.S. electrical mains-compatible device (or, equivalently, through the 220 $V_{AC}$ power cable in the case of a typical European electrical mains-compatible device, or similarly for devices designed for use in other region or countries). The device power draw is measured, and hence this approach is advantageously applicable to any device drawing mains power. However, it might be considered that such an approach is impractical because it is not known when the device is in its various operating modes. This difficulty could be overcome by integrating the input power monitoring with information obtained from on-board device electronics—but this would again make the system device-specific, and moreover would require developer-level access to the on-board device electronics.

To overcome this difficulty, it is further disclosed herein to model monitored input power-versus-time data using a state model that models the device power draw as a time series of discrete time instants t (spaced by a state model update time interval denoted herein as $\Delta t$ where it is contemplated to up-sample or down-sample the acquired input power-versus-time series to match the state model, e.g. input power draw data acquired every second may be down-sampled to 10-second time intervals if the state model updates at $\Delta t=10$ sec). The state model represents device power draw as an active mode (denoted without loss of generality as mode k=0) followed by a sequence of 1, . . . , K inactive modes comprising one or more intermediate inactive modes 1, . . . , K−1 each of a (possibly configurable) bounded time duration (e.g., measured in integer units of the time interval $\Delta t$) with the $K^{th}$ mode being a final inactive mode that terminates the inactive modes sequence and is of unbounded duration. Each inactive mode 1, . . . , K may transition at any time back to the active mode in response to a device activation signal, such as receipt of a print job via an electronic data network in the case of a printing device, or pressing the "scan" button in the case of an optical scanner, et cetera. The state model provides a probabilistic representation of the transition from any of the inactive modes to the active mode in response to a device activation signal, for example in the form of a transition probability $\zeta$ per time interval $\Delta t$. The state model is fitted to the power-versus-time series measured for the device to determine (at least) the power draw $\mu_k$, k=1, . . . , K for the K inactive modes (where power draw $\mu_k$ may be a mean or other "average" power draw in some statistical sense). In some illustrative embodiments, other model parameters such as the transition times $\tau_k$,k=1, . . . , K−1 of the intermediate inactive modes, the per-time interval probability $\zeta$ of initiating an active operation, a corresponding per-time interval probability $\eta$ of terminating an active operation, other statistical power draw parameters (e.g., the power draw $\mu_0$ of the active mode, a power draw variance $\sigma_k$ for each mode k=0, . . . , K), and so forth may be fitted. To provide for robust model fitting, in some preferred embodiments the number of inactive modes K and a maximum time duration of the inactive modes sequence M are given constraints; however, it is contemplated to fit one or both of these as parameters as well. It should be noted that the specific notational symbols, e.g. K, M, $\mu$, $\tau$, et cetera, are used herein for convenience, and alternative/other symbols and/or other model configurations are also contemplated.

The device modes k=0, . . . , K of the device are referred to herein as "modes" while the states of the state model are referred to herein as "states". This terminology is used herein to distinguish operational "modes" of the device from "states" of the state model. It is to be understood that the manufacturers of some commercial devices may refer to device operational modes as "states", for example possibly referring to the final inactive mode as a "standby state"—the skilled artisan will readily recognize such a "standby state" to be a device mode as that term is used herein. Each device mode is represented in the state model by one or more states of the state model.

With reference to FIG. 1, an illustrative power consumption profiling system performs power consumption profiling for a device, such as an illustrative (multifunction) printer 4 in illustrative FIG. 1. The device 4 is configured to operate in an active mode and to transition through a sequence of inactive modes comprising one or more intermediate inactive modes each having a bounded time duration terminating in a final inactive mode of unbounded time duration. The device 4 is further configured to transition from any of the inactive modes to the active mode in response to a device activation signal, such as receipt of a print job via a printer network 6, pressing a "scan" button (not shown) of the device 4 to initiate a photocopy, or so forth. The device 4 includes a power cable 8 that plugs into a wall outlet to connect with 110 $V_{AC}$ power (in the U.S.) or with 220 $V_{AC}$ power (in Europe) or so forth. The device 4 draws electrical power from the 110 $V_{AC}$ or 220 $V_{AC}$ mains via the power cable 8.

The power consumption profiling system includes a power meter 10, 12 configured to measure power drawn by the device 4. In illustrative FIG. 1, power meter 10, 12 includes a clamp-on ammeter 10 that acquires an induced voltage in response to a.c. electrical current flowing through the power cable 8 onto which the clamp-on ammeter 10 is installed, and further includes readout electronics 12 that converts the induced voltage to a power value. The power meter 10, 12 can, for example, be a commercially available clamp-on ammeter. The power meter can take other configurations, such as a wall-plug unit (not shown) that installs onto the 110 $V_{AC}$ or 220 $V_{AC}$ mains receptacle and into which the power cable 8 plugs, so that electrical power flows from the mains through the wall-plug unit into the power cable 8—the wall-plug unit then has suitable electronics for measuring the power flow. These power meter embodiments are advantageously installable in the field without modification to any of the device 4, its power cable 8, or the mains receptacle, and moreover can be installed to monitor any device that draws its electrical power from the mains (e.g. can be installed on any printer, scanner, facsimile machine, desktop computer, et cetera). It is alternatively contemplated for the power meter to be integrated into a power supply or other component of the device 4, or integrated into the interior wiring of the building (i.e. into the electrical mains), or spliced into the power cable 8, et cetera.

With continuing reference to FIG. 1, an electronic data processing device, such as an illustrative computer 20, is programmed to perform power profiling of the device 4 based on the power drawn by the device 4 as measured by the power meter 10, 12. The illustrative computer 20 is programmed to implement a power-versus-time series logger 22 which collects a time series of samples (also called observations) of the power drawn by the device 4 as measured by the power meter 10, 12 at discrete times. This can be done in various ways depending upon the configuration of the hardware 12, 20. For example, in some embodiments the clamp-on ammeter electronics 12 include analog-to-digital (A/D) converter electronics and digital input/output (I/O), and communicates digitally formatted power samples to the computer 20. In such embodiments, the time series logger 22 may be partly or entirely instantiated in the ammeter electronics 12. In other embodiments the clamp-on ammeter electronics 12 generate an analog voltage output and the computer includes an A/D converter card or other conversion circuitry that digitizes the analog voltage output by the ammeter electronics 12, and the computer 20 is further programmed to acquire a time series of power samples over a user-specified time interval so as to instantiate the time series logger 22. It is also contemplated to variously integrate the hardware 12, 20, for example by configuring the clamp-on ammeter electronics 12 as a plug-in card that is installed in the computer 20. In general, the output of the power-versus-time series logger 22 is a time series of samples (observations) of input power, for example one observation acquired per second over a 12-hour interval (43,200 observations in total) by way of one illustrative example. The time series of observations of input power to the device 4 is preferably acquired during "normal" operation of the device 4. For example, the time series of observations may be acquired while the device 4 is being used for office tasks such as printing, document scanning, facsimile transmission, and so forth. However, it is also contemplated for portions or all of the time series of observations may be acquired while the device 4 is being used in some specialized way, such as during a device calibration or with the device cycled through the K+1 modes for the purpose of generating data on each mode.

With continuing reference to FIG. 1, the computer 20 is further programmed to implement modeling components 26, 30 that determine the average power draw of the device 4 in each of the inactive modes by fitting a state model to the time series of observations of the power draw of the device generated by the time series logger 22 using the power meter 10, 12. The state model comprises states representing the active mode, the one or more intermediate inactive modes including their respective bounded time durations, and the final inactive mode. The model fitting includes estimating at least some of the model parameters to best fit the state model to the time series of observations. In illustrative examples disclosed herein, the parameters that are estimated by the model fitting include: power draw parameters of the states representing the active and inactive modes (e.g. power mean $\mu_k$ and variance $\sigma_k$ for each mode k=0, . . . , K), a per-time interval probability $\zeta$ of initiating an active operation, and a per-time interval probability $\eta$ of terminating an active operation. In some embodiments, the fitted parameters further include the transition times $\tau_k$, k=1, . . . , K−1 of the intermediate inactive modes. Some model parameters may be held fixed, i.e. provided as user inputs or constraints. In illustrative examples disclosed herein, the fixed (i.e. user inputted) constraints include the number of modes K and a maximum time duration of the inactive modes sequence M. The model fitting is performed by a parameters estimation module 30, which in the illustrative embodiments employs an illustrative quasi-deterministic hidden Markov Model (QDHMM) disclosed herein. Convergence of the model fitting is dependent upon the initial values chosen for the fitted parameters. In the illustrative example of FIG. 1, these initial parameter values are chosen using a clustering module 26 which clusters the observations of the time series based on power level into K+1 clusters corresponding to the active mode (k=0) and the 1, . . . , K inactive modes. Other approaches can be used to generate initial values for the fitted parameters.

The output of the model fitting performed by the parameters estimation module 30 includes estimated values for all fitted parameters, such as (for the illustrative examples) the mode power parameters $(\mu_k, \sigma_k)_{k=0}^K$, the transition probabilities $\zeta$ and $\eta$, and (if fitted) the transition times $\tau_k$, k=1, . . . , K−1 of the intermediate inactive modes. Of these illustrative parameters, the transition probabilities $\zeta$ and $\eta$ are indicative of device demand, rather than being characteristics inherent to the device 4. The transition times $\tau_k$ are (for many devices) user configurable, in which case the transition times $\tau_k$ are also not characteristics of the device 4, but rather indicate the chosen user configuration of the device 4. The mode power parameters $(\mu_k, \sigma_k)_{k=0}^K$ are typically characteristic of the device 4. For profiling energy consumption, the mean power $\mu_k$ is of interest, since the power variation over time measured by the variance $\sigma_k$ is expected to have a time average of zero. Moreover, the power drawn in the active mode $(\mu_0)$ is not usually useful information for optimizing the device 4 to reduce its energy draw, since the device 4 enters the active mode whenever an active job is executed and is therefore not amenable to configuration to reduce energy draw.

Thus, as shown in illustrative FIG. 1, the useful output of the model fitting module 30 is the mean power for each inactive state 32, that is, the inactive mode power parameters $(\mu_k, \sigma_k)_{k=1}^K$. While these are the outputs of the model fitting module 30 in illustrative FIG. 1, depending upon the intended application of the device modeling additional and/or other fitted model parameter values may be useful outputs. For example, if power draw is to be optimized over all printers on the printer network 6, then the power draw $\mu_0$ in the active mode may be a useful output since different printers on the network 6 may have different values for the active mode average power draw $\mu_0$, and the optimization may include preferentially sending print jobs to printers that are more energy efficient (that is, have lower average power draw $\mu_0$). In the same context, the fitted value for the per-time interval probability $\zeta$ of initiating an active operation is a metric of device demand (where higher $\zeta$ corresponds to higher device demand). For high $\zeta$ values the device is unlikely to reach the deeper sleep modes (higher k values) that reduce energy consumption. Accordingly, when optimizing over all all printers on the printer network 6, the fitted values for the probability $\zeta$ may be useful outputs that can be utilized to improve demand balancing across the printer network 6. In another context, the transition times $\tau_k$ may be useful outputs to detect printers that have been reconfigured by users to stay in lower k modes longer (which benefits the user since printer deep sleep is delayed so as to provide fast print job response, but which may adversely impact energy usage of the office).

Returning again to the illustrative example of FIG. 1 in which the outputs 32 of the model fitting module 30 are the inactive mode power parameters $(\mu_k, \sigma_k)_{k=1}^K$, these outputs characterize the device 4. In some embodiments, these values are taken to be characteristic not only of the specific device 4 that is measured by the power meter 10, 12 to perform the power consumption profiling, but rather are taken to be characteristic of all printers of the same make/model as the device 4. In such a case, a device optimization module 40 implemented by the electronic data processing device 20 is further configured to optimize the bounded time durations of the one or more intermediate inactive modes (corresponding to the model transition times $\tau_k$) for inputs including device demand statistics 42 and the determined power draw statistical characteritics $(\mu_k, \sigma_k)_{k=1}^K$ of the device in each of the inactive modes, which is the output 32 of the model fitting module 30. In one approach, the device demand statistics 42 are used to compute a value for the per-time interval transition probabilities $\zeta$ and $\eta$, and then the transition times $\tau_k$ of the state model are optimized with $(\mu_k, \sigma_k)_{k=0}^K$ fixed to the values output by the model fitting module 30 and $\zeta$, $\eta$ fixed to the values computed from the device demand statistics 42. This optimization optimizes an objective function balancing energy efficiency (which is typically increased by reducing $\tau_k$ values) with average print job delay introduced by warm-up of the device 4 (which may be measured manually for the transition from each inactive mode to the active mode, e.g. by measuring a delay $d_k$ for starting a print job when the printer is in inactive mode k). If only the specific device 4 for which the time series was observed is to be optimized, and if the time series is suitably representative of typical use of the device 4 (which is reasonable if the time series of observations was acquired over representative time period(s) of ordinary office use of the device 4) then the device demand statistics 42 can be omitted and the transition probabilities $\zeta$, $\eta$ can be set to the optimized values generated by the model fitting module 30.

The output 44 of the device optimization module 40 are optimized transition times $(\tau_k)_{k=1}^{K-1}$ for the intermediate inactive modes 1, ..., K−1. In diagrammatic FIG. 1, these values 44 are input to the printer network 6 which configures the printers on the network with the optimized transition times $(\tau_k)_{k=1}^{K-1}$. Alternatively, these values 44 may be provided to a human network administrator, e.g. via a display device 46, and the network administrator then manually configures the transition times for each printer on the network 6 to the optimized transition times $(\tau_k)_{k=1}^{K-1}$.

It will be appreciated that the disclosed data processing performed by the computer 20 may additionally or alternatively be embodied by a non-transitory storage medium storing instructions readable and executable by an electronic data processing device (such as the illustrative computer 20) to perform the disclosed methods. For example, the non-transitory storage medium may include one or a combination of the following non-limiting illustrative examples: a hard disk or other magnetic storage medium; an optical disk or other optical storage medium; a FLASH memory, read-only-memory (ROM) or other electronic storage medium; or so forth.

Having provided an overview of an illustrative energy consumption profiling system with reference to FIG. 1, some illustrative examples are next described, in which the state model is an illustrative quasi-deterministic hidden Markov Model (QDHMM) disclosed herein. These illustrative examples employ the following assumptions, which the inventors have found to hold for many different commercially available multi-function printers. Although these assumptions have been tailored for that class of devices, the QDHMM model is applicable to any kind of device for which the assumptions hold. First, it is assumed that the device spends most of its time waiting for a job to arrive. In other words, the amount of time spent actually executing a job (that is, in the active mode, k=0) is small compared to the the amount of time spent waiting (that is, in one of the inactive modes k=1, ..., K). This assumption holds for typical office use of printers, facsimile machines, scanners, and so forth.

Second, during job execution (that is, in phase k=0) the power consumption is assumed to be stochastic but stationary: it may vary a lot in time, but with no specific trend or pattern. On a short time scale, power may vary with different operations such as scanning, marking, moving pages or trays, and so forth; but on a longer time scale, such as power sampling every second over the course of a print job, these different operations, many of which overlap in time, just add up to form a random signal around a stationary mean.

Third, when the device is inactive, the power consumption follows a quasi-deterministic pattern: typically, the device executes a partial shutdown procedure, characterised by a fixed sequence of operations (up to some noise). These are the one or more intermediate inactive modes k=1, K−1 each having a bounded time duration. Once the procedure is complete, the device reaches a stable mode ("deep sleep") in which the power consumption is quasi-constant (up to some noise). This is the final inactive mode K of unbounded time duration. In any mode, as soon as a job arrives (or other device activation signal is received), the quasi-deterministic sequence is interrupted, whatever its progress, and the job execution pattern takes over.

Although the device 4 upon ending an active job is expected to go through the shutdown sequence represented by the inactive modes k=1, ..., K, which is quasi-deterministic, this sequence of inactive modes is generally different for each device type and model (for example, the number of inactive modes K is generally different for each device type/model, as are the power consumed in each inactive mode), and further depends in general upon user-configurable settings such as the start time of specific blocks of operations within that sequence (corresponding to the model transition times $\tau_k$; also referred to in the art by terms such as "timeouts"). Given the number of inactive modes (K) of the device, it is desired to recover, from the time series of observations of the energy consumption, the mean and variance of the power consumption in each of the inactive modes, as well as in the mean and variance of the power consumption (undifferentiated respective to the various operations, e.g. marking, paper movement, et cetera) in the active phase (k=0). In the illustrative examples, the number of modes K is a constraint, that is, the fitting of the model to the time series of observations does not attempt to recover the number of modes itself. (If the number of modes is unknown, then the problem would be ill-posed as there could be as many modes as there are discrete time units in the deterministic sequence or, at the other extreme, the whole sequence could be considered a single mode.) In the illustrative QDHMM, each mode k is characterized by a distinct mean $\mu_k$ and variance $\sigma_k$ of its energy consumption.

Figure 2:
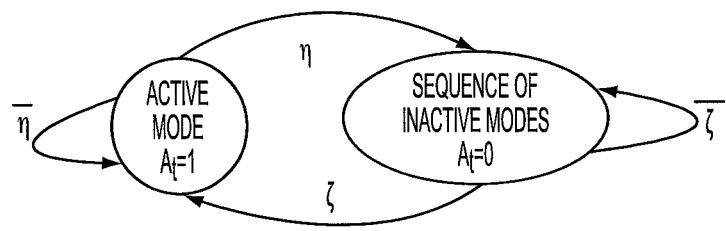
FIGS. 2-4 diagrammatically show state diagrams of some state models suitably employed in the quasi-deterministic hidden Markov model (QDHMM) parameters estimation module of the system of FIG. 1.

With reference to FIG. 2, the QDHMM (illustrative state model) captures the behaviour of the device 4 assuming quasi-deterministic behaviour during the inactive modes. At each discrete instant t, the device 4 can be either active $A_t=1$ (executing a job) or inactive $A_t=0$ (waiting for a job). It is assumed that $A_t$ forms a Markov chain with states in $\{0,1\}$ in accordance with the state diagram shown in FIG. 2. The transition parameter $\eta$ is the probability of starting a job when none is ongoing (that is, of switching to the active mode in response to a device activation signal), and the transition parameter $\zeta$ is the probability of ending an ongoing job (that is, transitioning from the active mode into the sequence of inactive modes). It follows that $\bar{\zeta}=1-\zeta$ is the probability of continuing an ongoing job (said otherwise, $\zeta+\bar{\zeta}=1$), and similarly $\bar{\eta}=1-\eta$ is the probability of remaining in the sequence of inactive modes (said otherwise, $\eta+\bar{\eta}=1$). Each of these probabilities is per-time interval $\Delta t$ of the state model, where $\Delta t$ is the update interval for the state model. The state model of FIG. 2 captures certain features of the behavior of device 4, but does not capture the aspect of the sequence of inactive modes including one or more intermediate inactive modes each having a bounded time duration.

Figure 3:
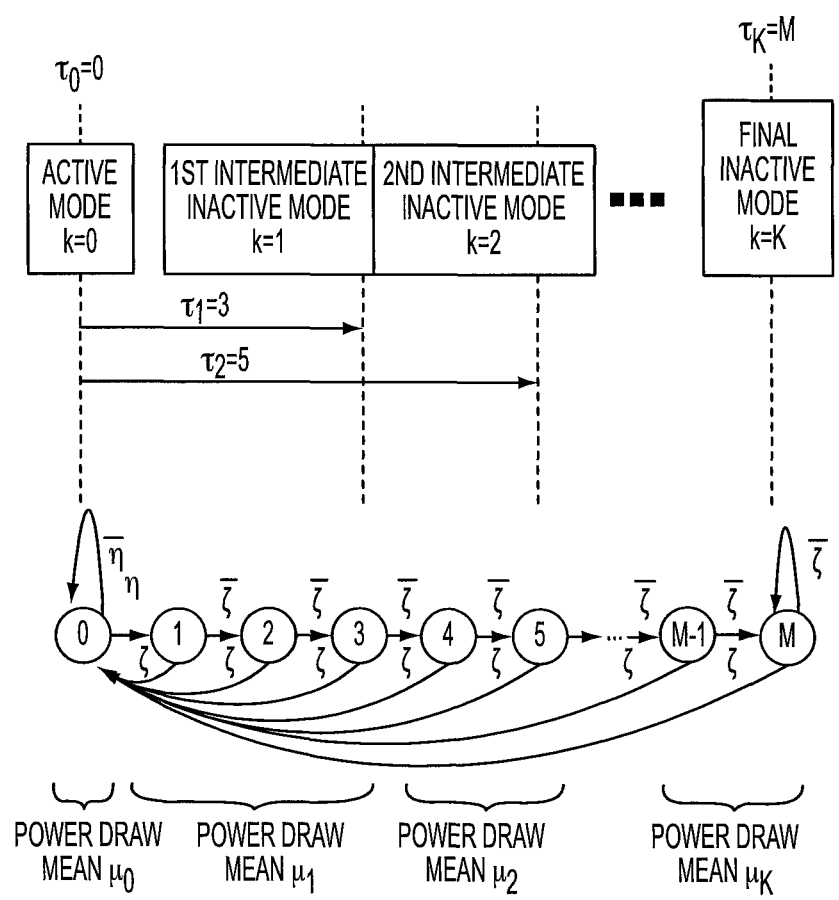

With reference to FIG. 3, the QDHMM state model can be extended to capture this aspect. The following random variable is defined:

$$Z_t =_{def} t - \max\{t' \le t | A_{t'}=1\} \quad (1)$$

The random variable $Z_t$ is the elapsed time since the last active instant. Note that $Z_t=0$ iff $A_t=1$, i.e. the device is active at time t. The random variable $Z_t$ forms a Markov chain, with infinite state space $\{0: \infty\}$. Assuming the initial distribution is geometric, the state model is characterized by:

$$Z_{t+1}|Z_t=0: \text{Cat}(1{:}\eta; 0{:}\bar{\eta})$$

$$\forall z \ge 1 \ Z_{t+1}|Z_t=z: \text{Cat}(0{:}\zeta; z+1{:}\bar{\zeta})$$

$$Z_0: \text{Geometric}(0{:}\bar{\rho}) \quad (2)$$

Let $Y_t$ denote the observed energy consumed by the device 4 over the period between t and t+1. Further assume that $Y_t|Z_t$ follows a staged normal distribution, parametrized by scalars $(\mu_k, \sigma_k, \tau_k)_{k=0}^K$, where the sequence of integers $(\tau_k)_{k=0}^K$ is strictly increasing from $\tau_0=0$ to $\tau_K=\infty$. Then:

$$Y_t|Z_t=0 \sim \text{Normal}(\mu_0, \sigma_0) \tag{3}$$

and $$\forall k \in 1:K \ \forall z \in \{\tau_{k-1}+1:\tau_k\} \ Y_t|Z_t=z \sim \text{Normal}(\mu_k, \sigma_k) \tag{4}$$

Expression (3) represents the fact that the active mode (k=0) is undifferentiated (that is, characterized by mean and standard deviation $\mu_0$, $\sigma_0$), and that the sequence of inactive modes consists of a sequence of k=1, ..., K modes, each characterized by a mean $\mu_k$ and standard deviation $\sigma_k$ and by a deterministic interval of occurrence, between instant $\tau_{k-1}+1$ and $\tau_k$ inclusive, while the device is in the sequence of inactive modes.

The overall set of parameters of the illustrative QDHMM is therefore:

$$\theta = \langle K, \rho, \eta, \zeta, (\mu_k, \sigma_k, \tau_k)_{k=0}^K \rangle \tag{5}$$

Parameters K and $(\mu_k, \sigma_k)_{k=0}^K$ are physical characteristics of the device 4, whereas parameters $\rho, \eta, \zeta$ depend on the demand. Parameters $(\tau_k)_{k=1}^{K-1}$, which describe the schedule of the one or more intermediate inactive modes during the inactivity phase, may be user-configurable parameters of the device 4.

The foregoing assumes that the latent state variable $Z_t$ lives in an infinite space. This assumption can be removed as follows. Choose M to be an integer such that $M > \tau_{K-1}$ and define the random variable $\dot{Z}_t = \min(Z_t, M)$, Equation (2) becomes:

$$\dot{Z}_{t+1}|\dot{Z}_t = 0: \text{Cat}(1:\eta; 0:\overline{\eta n})$$

$$\forall z \in 1:M \ \dot{Z}_{t+1}|\dot{Z}_t = z: \text{Cat}(0:\zeta; \min(z+1,M):\overline{\zeta})$$

$$\dot{Z}_0: \text{Cat}(\{z: \overline{\rho}\rho^z\}_{z=0}^{M-1}; M: \rho^M) \tag{6}$$

In this approach, M is an upper length limit or constraint on the combined lengths of the Markov chains of states representing the intermediate inactive modes k=1, ..., K−1.

With reference to FIG. 3, a state diagram is shown of this version of the QDHMM which is bounded by M. In the illustrative example of FIG. 3, the one or more intermediate inactive modes of the sequence of inactive modes includes a first inactive mode k=1 represented by a Markov chain including states "1", "2", and "3". The length of this Markov chain is effective to represent the finite duration $\tau_1$ of state k=1. In the illustrative example of FIG. 3, a second intermediate inactive state k=2 is represented by a Markov chain including states "4" and "5" whose length is effective to represent the finite duration $\tau_2-\tau_1$ of state k=2. The final inactive state k=K of unbounded time duration is represented at least by the final state "M" of the Markov chain representing the sequence of inactive modes. Since the constraint is $M > \tau_{K-1}$ (and not some more aggressive constraint such as $M = \tau_{K-1}+1$), the final inactive mode k=K may be represented by more than one of the terminal states, e.g. in illustrative FIG. 3 the final inactive mode k=K may be represented by the states "M−1" and "M", by way of illustrative example. If the transition times $\tau_k$ are to be fitted as part of the model fitting, then M should be chosen to be long enough to accommodate the largest credible value for the combined lengths of the Markov (sub-)chains of states representing the intermediate inactive states that, combined along with at least one state representing the final inactive state k=K, form the Markov chain representing the sequence of inactive modes. In the Markov chain of states "1", ..., "M" that represents the sequence of inactive modes, each intermediate active mode k=1, ..., K−1 is represented by a sub-chain of one or more states of the Markov chain of states, where the states of the sub-chain have the same power draw parameter values (e.g., same mean $\mu$ and variance $\sigma$). This is diagrammatically indicated for the means $\mu$ (which are the output 32 of interest in illustrative FIG. 1).

The transition matrix P (mostly sparse) of the Markov chain is given by:

$$P = \begin{pmatrix} \overline{\eta} & \eta & & \\ \zeta & & \overline{\zeta} & \\ \vdots & & & \ddots \\ \zeta & & & \overline{\zeta} \\ \zeta & & & \overline{\zeta} \end{pmatrix} \tag{7}$$

And the initial distribution Q of the Markov chain is given by:

$$Q = \overline{\rho}\left(1, \rho, \ldots, \rho^{M-1}, \frac{\rho^M}{\overline{\rho}}\right) \tag{8}$$

The emission distribution of the bounded model is essentially identical to that of the unbounded model:

$$Y_t|\dot{Z}_t = 0 \sim \text{Normal}(\mu_0, \sigma_0) \tag{9}$$

and $$\forall k \in 1:K \ \forall z \in \{\tau_{k-1}+1:\tau_k\} \ Y_t|\dot{Z}_t = z \sim \text{Normal}(\mu_k, \sigma_k) \tag{10}$$

with $\tau_K = M$ instead of $\tau_K = \infty$. This holds for the constraint $M > \tau_{K-1}$.

Figure 4:
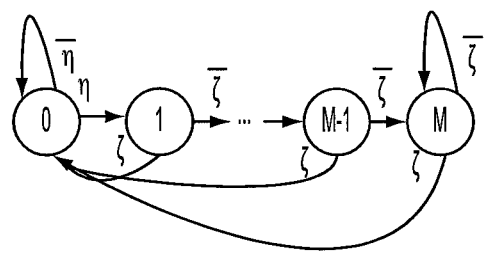

With reference to FIG. 4, the general state diagram for the QDHMM bounded by constraint M is illustrated, without any illustrative superimposed intermediate inactive modes. This is an appropriate representation, especially since the transition times $\tau_k$ may be fitted parameters of the QDHMM (bounded by the constraint $M > \tau_{K-1}$).

Having described the QDHMM as an illustrative state model, some illustrative techniques for fitting the model to the time series of observations measured for device 4 using the power meter 10, 12 are next described. In general, of the set of parameters given in Expression (5), the number of modes K is assumed to be a given constraint that is not fitted, and the Markov chain length M is also assumed to be a given constraint (M constrains fitted $\tau_{K-1}$ to be less than M, which also effectively constrains any other transition times since $\tau_{K-1} > \tau_{K-2} > \ldots > \tau_1$ must hold). The remaining parameters $\rho, \eta, \zeta, (\mu_k, \sigma_k, \tau_k)_{k=0}^K$ of Expression (5) are fitted parameters except that (i) $\tau_0 = 0$ and $\tau_K = \infty$ are fixed values (or, viewed alternatively, may be considered as undefined in the M-bounded QDHMM) and (ii) in a variant embodiment it is contemplated for $(\tau_k)_{k=1}^{K-1}$ to also be constant, e.g. user-supplied, values which are not fitted as part of the model fitting. This is appropriate if, for example, the mode timeout values configured for the printer 4 when the time series of observations is acquired are known, and hence are readily identified as fixed inputs to the model fitting.

The illustrative QDHMM is an instance of a hidden Markov model (HMM), to which standard training and inference algorithms are applicable (Viterbi, Baum-Welsh et cetera). The QDHMM is fitted to the time series of observations, suitably represented as a family $y = (y_{rt})_{rt \in T}$ of scalar observations, where $T = \{r, t | r \in \{1: R\}, t \in \{0: T_r\}\}$. Each sub-sequence $(y_{rt})_{t=0}^{T_r}$ for a given $r \in \{1: R\}$ represents a sequence of length $T_r$ of power consumption readings of the device over a given period of time, at equidistant sampling instants.

Thus, for each $r \in \{1: R\}$, the sequence $(y_{rt})_{t=0}^{T_r}$ is a sample of the random process $(Y_t)_{t=0}^{\infty}$ truncated at length $T_r$. The sequences are assumed to be independent. In practice, each sequence typically represents a half-day of operation of the device 4. The sequences for two consecutive half days are implicitly dependent if they are acquired with no intervening time gap, in that the latent state at the end of one sequence is identical to that at the beginning of the other—however, the impact of this is minimal and can be ignored. Given the number of modes K and the Markov chain length M as inputs (i.e. constraints), all the other parameters are estimated from the data using (in the illustrative model fitting described below) the Baum-Welsh algorithm, which is the specialization of the expectation-maximization (EM) algorithm for HMM in general, and which is further specialized as disclosed herein for the QDHMM.

In the QDHMM, the Markov chain parameters characterizing the state dynamics are $\rho, \eta, \zeta$. Their updates at each iteration can be derived from the update formulas of the standard Baum-Welsh algorithm, adapted to the choice of parameterization of the Markov chain in the QDHMM. At each iteration of the EM algorithm, the usual $\gamma, \zeta$ statistics are computed in the normal way (E-step), using the current estimate of the model parameters. These quantities characterize the posterior distributions $\gamma_{rt}(z) = p(Z_{rt} = z|y)$ and $\zeta_{rt}(z_1 z_2) = p(Z_{r(t-1)} = z_1, Z_{rt} = z_2|y)$. Then, the usual update to the transition matrix is given by:

$$P'_{z_1 z_2} \propto \sum_{rt \in T} \xi_{rt}(z_1 z_2) \quad (11)$$

which has the same sparsity pattern as P given in Expression (7), since each $\zeta_{rt}(z_1 z_2)$ is proportional to $P_{z_1 z_2}$. On the other hand, P' has no reason to be of the specific form of Expression (7), so P' is projected onto the expected matrix space. This solves exactly the M-step of the EM algorithm for the transition parameters $\eta, \zeta$:

$$\eta^* = P'_{01} \text{ and } \zeta^* = \frac{1}{M} \sum_{z=1}^{M} P'_{z,0} \quad (12)$$

Similarly, the usual update Q' of the initial distribution Q is adapted to conform to Expression (8), leading to the update of $\rho$:

$$\frac{\rho^*}{\overline{\rho}^*} = \frac{\sum_{z=0}^{M} z Q'_{z'}}{1 - Q_{M'}} \text{ where } Q_{z'} \propto \sum_{r=1}^{R} \gamma_{r0}(z) \quad (13)$$

The updates to the emission parameters $\mu, \sigma, \tau$ are to be plugged into the Baum-Welsh algorithm. They are obtained by solving the following optimization problem:

$$\operatorname*{argmax}_{\mu, \sigma, \tau} \sum_{rt \in T} \sum_{z=0}^{M} \gamma_{rt}(z) \log(p(y_{rt} | z; \mu, \sigma, \tau)) \quad (14)$$

For a given sequence $\tau = (\tau_k)_{k=0}^K$, let $(D_k(\tau))_{k=0}^K$ be the partition of $\{0: M\}$ defined as follows:

$$D_0(\tau) =_{def} \{0\} \quad \forall k \in \{1: K\} D_k(\tau) =_{def} \{\tau_{k-1} + 1: \tau_k\} \quad (15)$$

Hence $D_k(\tau)$ represents the interval of inactive states which are in mode k for $k \in \{1: K\}$, and the single active state 0 for $k = 0$. The optimization problem of Expression (14) becomes:

$$\operatorname*{argmin}_{\mu, \sigma, \tau} \sum_{k=0}^{K} \sum_{rt \in T} \underbrace{\sum_{z \in D_k(\tau)} \gamma_{rt}(z)}_{W_k(\tau)_{rt}} \left( \frac{(y_{rt} - \mu_k)^2}{\sigma_k^2} + \log(\sigma_k^2) \right) \quad (16)$$

Observe that given $\tau$, the objective decomposes along each $k \in \{0: K\}$, and each of the components is the objective of the fit of a normal distribution against a sequence of weighted values, for which the solution is known: the optimal values, given $\tau$, of $(\mu_k, \sigma_k^2)$ for $k \in \{0: K\}$ are the empirical mean (notation avg) and variance (notation var) of the family y with the weights $W_k(T)$:

$$\mu_k^*(\tau) = \operatorname{avg}[Y; W_k(\tau)] \text{ and } \sigma_k^{2*}(\tau) = \operatorname{var}[y; W_k(\tau)] \quad (17)$$

Figure 5:
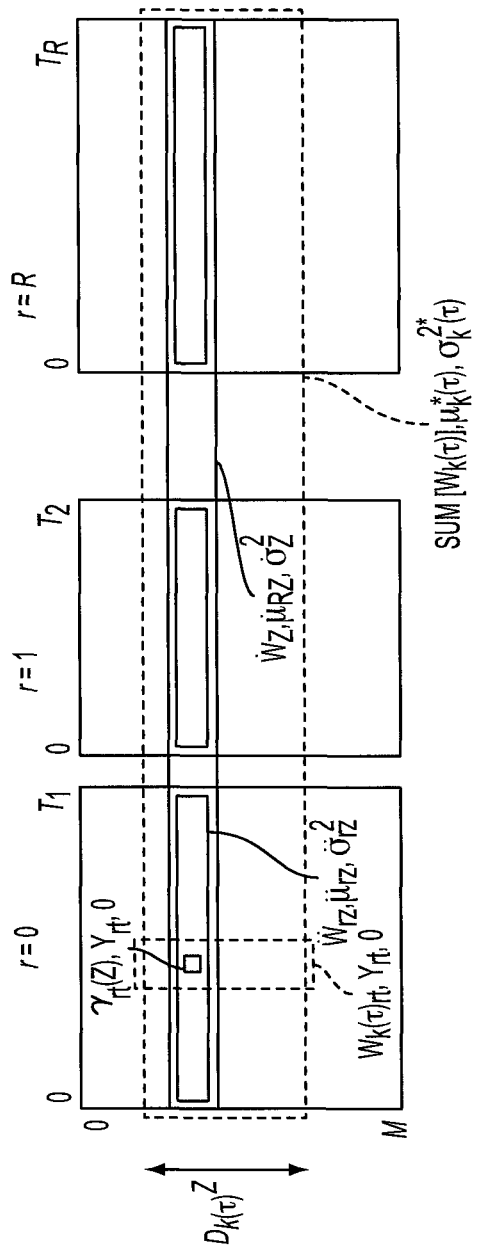
FIG. 5 diagrammatically shows segmentation of a time series of observations into a plurality of time series.

With reference to FIG. 5, the computation of these quantities can be performed in such a way that it does not need to hold the whole data y and all the $\gamma$ values in memory, which could be prohibitive. For any $r \in \{1: R\}$ and $z \in \{0: M-\}$, let:

$$\ddot{w}_{rz} =_{def} \operatorname{sum}[(\gamma_{rt}(z))_{t \in \{0: T_r\}}]$$

$$\ddot{\mu}_{rz} =_{def} \operatorname{avg}[(y_{rt})_{t \in \{0: T_r\}}; (\gamma_{rt}(z))_{t \in \{0: T_r\}}]$$

$$\ddot{\sigma}_{rz}^2 =_{def} \operatorname{var}[(y_{rt})_{t \in \{0: T_r\}}; (\gamma_{rt}(z))_{t \in \{0: T_r\}}]$$

$$\dot{w}_z =_{def} \operatorname{sum}[(\gamma_{rt}(z))_{rt \in T}]$$

$$\dot{\mu}_z =_{def} \operatorname{avg}[Y; (\gamma_{rt}(z))_{rt \in T}]$$

$$\dot{\sigma}_z^2 =_{def} \operatorname{var}[Y; (\gamma_{rt}(z))_{rt \in T}] \quad (18)$$

For each $r \in \{1: R\}$, the statistics $(\ddot{w}_{rz}, \ddot{\mu}_{rz}, \ddot{\sigma}_{rz}^2)_{z=0}^M$ are computed, using only the r-th data series, i.e. the sequence $(y_{rt})_{t=0}^{T_r}$ and corresponding weights $((\gamma_{rt}(z))_{z=0}^M)_{t=0}^{T_r}$. This is illustrated in FIG. 5, where the cell at row $z \in \{0: M\}$ and column $t \in \{0: T_r\}$ in the table indexed $r \in \{1: R\}$ represents the data value $y_{rt}$ with the weight $\gamma_{rt}(z)$. The total weight, average and variance of various cell groups are represented in FIG. 5. Then these statistics are used to incrementally update the quantities $(\dot{w}_z, \dot{\mu}_z, \dot{\sigma}_z^2)_{z=0}^M$, as detailed in Algorithm 1.

---

Algorithm 1

---

Procedure EEP($\dot{w}, \dot{\mu}, \dot{\sigma}^2$)
procedure EEP computes and returns the emission parameter
estimates $\mu_k^*, \sigma_k^{2*}, \tau_k^*$ for $k \in \{0: K\}$
first, pre-compute the statistics $\dot{w}_z, \dot{\mu}_z, \dot{\sigma}_z^2$ for $z \in \{0: M\}$
for each $z \in \{0:M\}$ set $\dot{w}_z, \dot{\mu}_z, \dot{\sigma}_z^2 := 0$
for each $r \in \{1:R\}$
  for each $z \in \{0: M\}$ $$\dot{w}_z \mathrel{+}= \ddot{w}_{zr}$$

set $a := \dfrac{\ddot{w}_{zr}}{\dot{w}_z}$ set $\Delta_\mu := \ddot{\mu}_{zr} - \dot{\mu}_z$
$\Delta_{\sigma^2} := \ddot{\sigma}_{zr}^2 - \dot{\sigma}_z^2$ set $\dot{\mu}_z \mathrel{+}= a \Delta_\mu$
$\dot{\sigma}_z^2 \mathrel{+}= a(\Delta_{\sigma^2} + (1-a)\Delta_\mu^2)$ -continued Algorithm 1 then, use the pre-computed statistics to estimate the emission parameters
if τ is not known a priori then set τ* := EEP-TAU($\dot{w}$, $\dot{\mu}$, $\dot{\sigma}^2$)
else set τ* := τ$_{known}$
return $\langle \text{avg}[1_{D_k(\tau^*)}\dot{w}], \text{var}[\dot{\mu}; 1_{D_k(\tau^*)}\dot{w}] + \text{avg}[\dot{\sigma}^2; 1_{D_k(\tau^*)}\dot{w}], \tau_k^* \rangle_{k=0}^{K}$ Algorithm 1 utilizes the following identities, which are direct consequences of the compositionality properties of operators sum, avg, var:

$$\dot{w}_z = \text{sum}[(\dot{w}_{rz})_{r \in \{1:R\}}] \quad (19)$$

$$\dot{\mu}_z = \text{avg}[(\dot{\mu}_{rz})_{r \in \{1:R\}}; (\dot{w}_{rz})_{r \in \{1:R\}}] \quad (20)$$

$$\dot{\sigma}_z^2 = \text{var}[(\dot{\mu}_{rz})_{r \in \{1:R\}}] + \text{avg}[(\dot{\sigma}_{rz}^2)_{r \in \{1:R\}}; (\dot{w}_{rz})_{r \in \{1:R\}}] \quad (21)$$

These identities are illustrated in Algorithm 2 (to be discussed further in conjunction with the optional fitting of the transition times $\tau_k$). Finally, using the same compositionality properties, it can be shown that:

$$\text{sum}[W_k(\tau)] = \text{sum } [1_{D_k(\tau)}\dot{w}] \quad (22)$$

$$\mu_k^*(\tau) = \text{avg } [Y; W_k(\tau)] = \text{avg}[\dot{\mu}; 1_{D_k(\tau)}\dot{w}] \quad (23)$$

$$\sigma_k^{2*}(\tau) = \text{var } [Y; W_k(\tau)] = \text{var}[\dot{\mu}; 1_{D_k(\tau)}\dot{w}] + \text{avg}[\dot{\sigma}^2; 1_{D_k(\tau)}\dot{w}] \quad (24)$$

Thus, if τ, which may depend on an explicit configuration of the device, is known a priori, then Equations (12), (13), (23) and (24) provide a complete description of the M-step of the EM algorithm.

As previously noted, the "transition time" value for the active mode is $\tau_0 = 0$, and for the final inactive state of unbounded duration (for the bounded QDHMM) $\tau_K = M$. As further previously noted, the transition times $(\tau_k)_{k=1}^{K-1}$ for the intermediate active modes may in some embodiments be input values (e.g. supplied based on a known configuration of the device 4 at the time that the time series of power observations is acquired), while in other embodiments these transition times $(\tau_k)_{k=1}^{K-1}$ are parameters to be fitted as part of the model fitting to the time series of power observations. The following describes a suitable fitting approach in the latter case, i.e. where transition times $(\tau_k)_{k=1}^{K-1}$ are parameters to be fitted. In this case the set of constraints $M > \tau_{K-1} > \ldots > \tau_1 > 0$ applies. Inserting the values of sum $[W_k(\tau)]$, $\mu_k^*(\tau)$ and $\sigma_k^{2*}(\tau)$ as given by Equations (22), (23) and (24), into the objective, and eliminating k=0 which contributes only a constant term, the objective becomes:

$$\tau^* = \underset{\tau}{\text{argmin}} \sum_{k=1}^{K} \phi(\{\tau_{k-1} + 1 : \tau_k\}) \quad (25)$$

where for any subset D of {0: M}, the following is defined:

$$\phi(D) =_{def} \text{sum}[1_D \dot{w}] \log(\text{var}[\dot{\mu}; 1_D \dot{w}] + \text{avg}[\dot{\sigma}^2; 1_D \dot{w}]) \quad (26)$$

Thus, the problem amounts to computing the cheapest length-K path between 0 and M when the cost of an edge z, z' where z<z' is $\phi(\{z+1: z'\})$. Note that function $\phi$ satisfies the super-additivity property: $\phi(D \cup E) \geq \phi(D) + \phi(E)$. The "length-K" constraint is therefore utilized in the cheapest path formulation of the problem, since, by super-additivity of $\phi$, if the length l of the paths was not constrained to l=K, the solution would be immediate: l=M and $\tau_k = k$ for k∈{0: M}, meaning that each time unit after the beginning of inactivity would constitute a stable mode with its own mean and variance in the emission. The length-K constraint forces these M micro-modes to merge together to form K longer modes.

The brute force solution entails computing the edge costs $\phi(\{z+1: z'\})$ for z<z', then applying a dynamic programming algorithm to compute the cheapest path (essentially Dijkstra's algorithm modified to account for the length-K constraint). Algorithm 2 provides a suitable formalism.

Algorithm 2

Procedure EEP-TAU($\dot{w}$, $\dot{\mu}$, $\dot{\sigma}^2$)
procedure EEP-TAU computes and returns the emission parameter estimates $\tau_k^*$ for k ∈ {0: K}
first, compute the edge cost matrix $(C_{z_o z})_{z_o \in \{0:M-1\}, z \in \{z_o+1:M\}}$ where $C_{z_o z} = \phi(\{z_o + 1:z\})$
for each $z_o$ ∈ {0: M − 1} # first main loop
  # This can be performed in parallel for each $z_o$; it computes (incrementally), for each z ≥ $z_o$ + 1, the quantities
  ω = sum[$u_z$]; $\hat{\mu}$ = avg [$\dot{\mu}$; $u_z$]; $\hat{\sigma}^2$ = avg [$\dot{\sigma}^2$; $u_z$]; $\tilde{\mu}$ = var [$\dot{\mu}$; $u_z$] where $u_z$ = $1_{\{z_o+1:z\}} \dot{w}$
  set ω, $\hat{\mu}$, $\hat{\sigma}_2$, $\tilde{\mu}$ = 0
  for each z ∈ {$z_o$ + 1:M}

ω += $\dot{w}_z$ set a := $\frac{\dot{w}_z}{\omega}$ set $\Delta_\mu := \dot{\mu}_z - \hat{\mu}$
      $\Delta_{\sigma^2} := \dot{\sigma}_z^2 - \hat{\sigma}^2$ set $\hat{\mu}$ += $a\Delta_\mu$
      $\hat{\sigma}_z^2$ += $a\Delta_{\sigma^2}$ set $\tilde{\mu} := (1 - a)(\tilde{\mu} + a\Delta_\mu^2)$
  set $C_{z_o z} : \omega \log(\tilde{\mu} + \hat{\sigma}^2)$
then, compute $(T_{k z_o})_{k \in \{1:K\}, z_o \in \{0:M-k\}}$ where $T_{k z_o}$ is the first step in the cheapest length-k path from $z_o$ to M for each $z_o$ ∈ {0 : M − 1} set $Q_{z_o} := C_{z_o M}$
                                $T_{1 z_o} := M$ for each k ∈ {2: K} # second main loop
  for each $z_o$ ∈ {0: M − k)

set $z^* := \underset{z \in \{z_o+1:M-k+1\}}{\text{argmin}} C_{z_o z} + Q_z$ set $T_{k z_o} := z^*$
        $Q_{z_o} := C_{z_o z^*} + Q_{z^*}$ finally, reconstruct the cheapest length-K path from 0 to M
set $\tau_0 := 0$
for each k ∈ {1: K} set $\tau_k := T_{(K-k+1) \tau_{k-1}}$
return $(\tau_k)_{k=0}^{K}$ In Algorithm 2, first, for each $z_o$ ∈ {0: M −1}, the vector of costs $\phi(\{z_o+1: z\})_{z=z_o+1}^{M}$ of the outgoing edges from $z_o$ is incrementally computed. Observe that this can be done in parallel for each value of $z_o$. Then, for each k∈{1: K} and each $z_o$∈{0: M−k}, the cost of the cheapest length-k path from $z_o$ to M, as well as its first step, is incrementally computed. This is done sequentially in k since it uses the fact that a cheapest length-k path to M consists of one edge followed by a cheapest length-(k−1) path to M, minimizing the sum of their costs. Finally, the steps are assembled together to obtain a cheapest length-K path from 0 to M, which is the estimate τ*.

The overall complexity of the brute force method is aM²+bKM, or $$\frac{aM^2}{N} + bKM$$

if the first main loop of the algorithm can be run in parallel on N cores, where a,b are, repectively, the time taken by one inner iteration in the two main loops. Typically, K is small (below 5), but M can be of the order of several 100. If the complexity is too high, at least two solutions are available. One solution is subsampling: dividing the sampling frequency by 3 divides the size of the data, and M, by 3, and the complexity of the first loop by 9. Another solution is stochastic search: the brute force method, which computes the exact minimum of the objective, can be replaced by a less costly but approximate method such as simulated annealing.

In the following, some illustrative experimental results are described comparing the disclosed QDHMM algorithm with other illustrative techniques.

Figure 6:
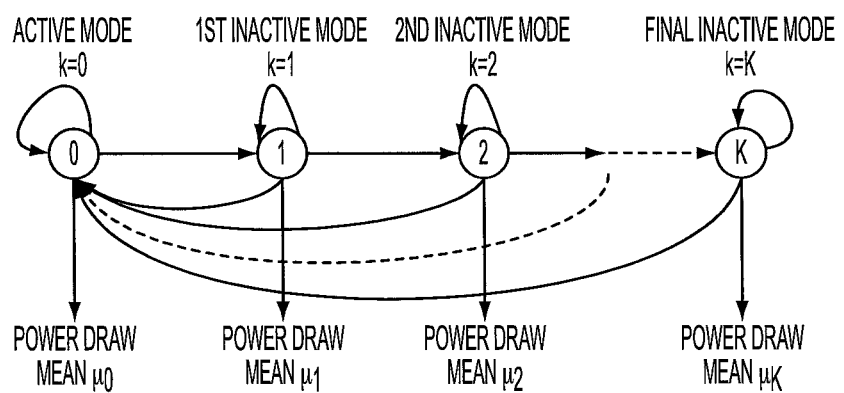
FIG. 6 diagrammatically shows a state diagram for a hidden Markov model (HMM) for modeling device power consumption in an active mode and in a sequence of inactive modes.

With reference to FIG. 6, the disclosed QDHMM is compared with a baseline state model which is a hidden Markov model (HMM) with K+1 states and transition matrix constrained to implement the state diagram shown in FIG. 6. In contrast with the disclosed QDHMM (where "QD" represents "quasi-deterministic"), in the baseline HMM of FIG. 6, there is one state for each mode k=0, . . . , K in the quasi-deterministic sequence, instead of one state for each time unit (i.e. states spaced apart by Δt), and self-transitions are allowed at all the states instead of just at k=0 and k=K (the two end states). Thus, in the HMM of FIG. 6 each intermediate active mode k=1, . . . , K −1 has a duration that follows a geometric distribution characteristic of HMM. By contrast, in the QDHMM disclosed herein each intermediate active mode k=1, . . . , K−1 has a duration that can be no longer than the time interval $\{\tau_{k-1}+1:\tau_k\}$, that is, they each have a fixed maximum duration (which in some embodiments is a fitted parameter).

Figure 7:
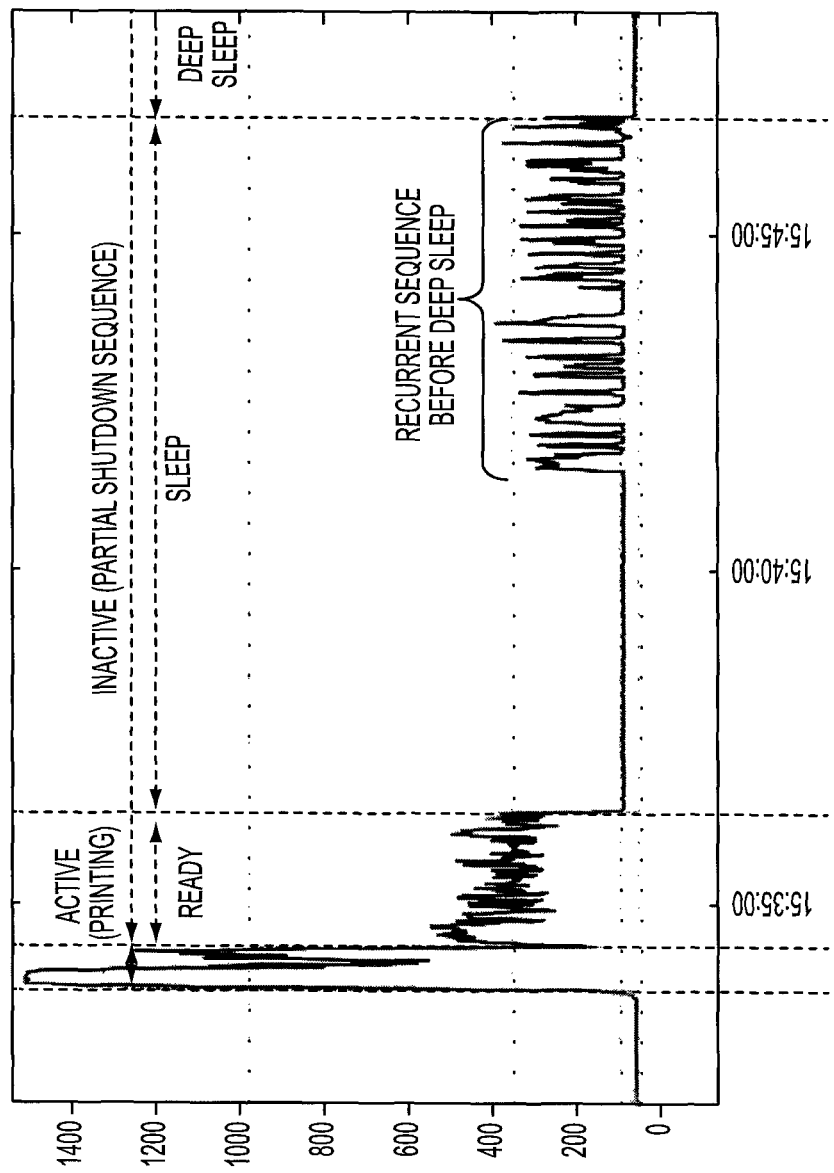
FIGS. 7-9 illustrate examples of measured time series of observations of power drawn by a multi-function printing device.
Figure 8:
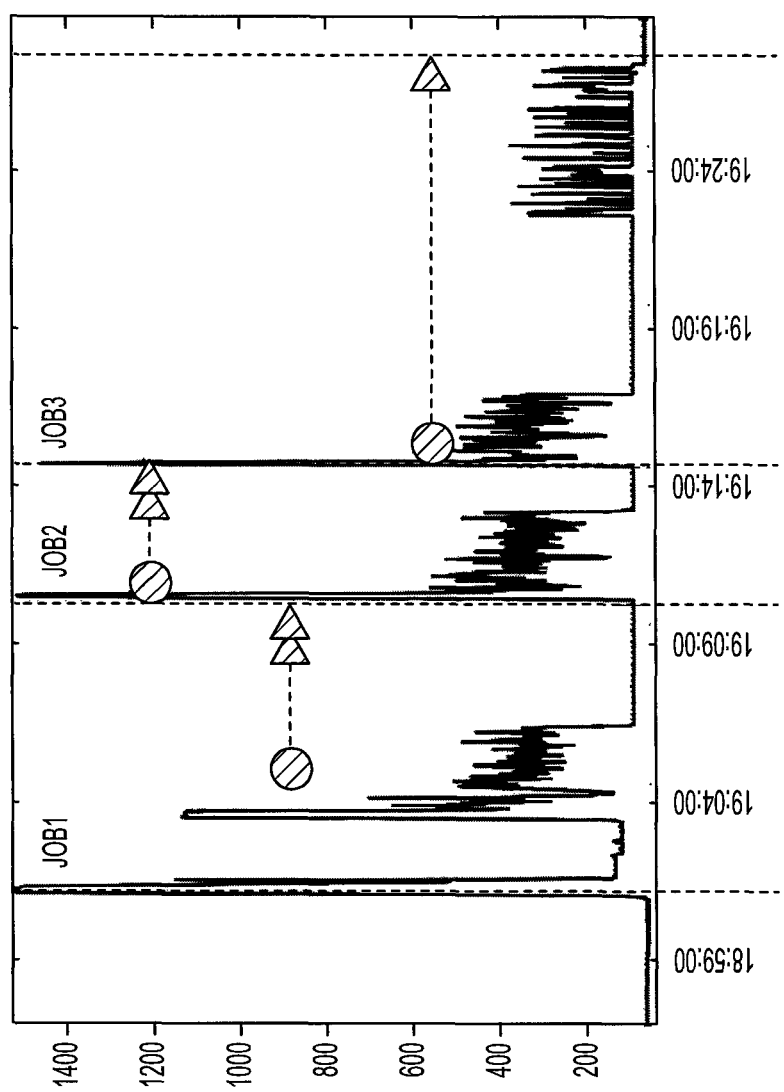
Figure 9:
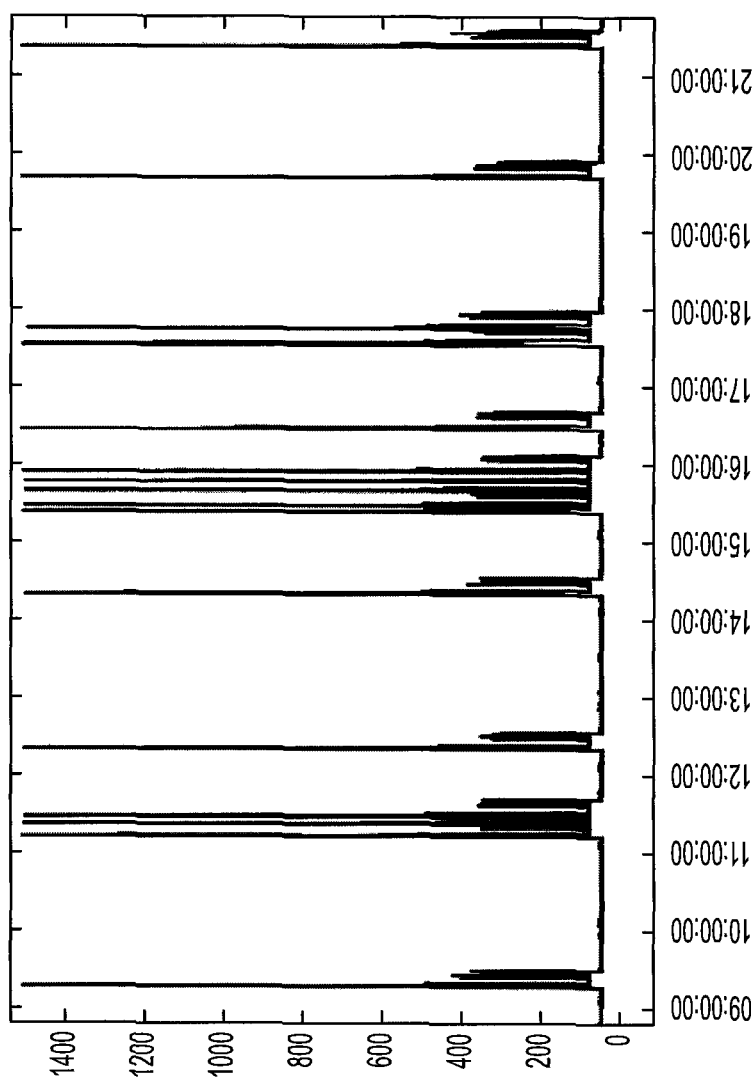

With reference to FIGS. 7-9, examples of measured time series of observations of power drawn by a multi-function printing device are illustrated. FIG. 7 shows a time series of observations measured for one print job. FIG. 8 shows a time series of observations measured for three successive print jobs. FIG. 9 shows a time series of observations measured for a whole day (24 hour period). These time series were measured using a power meter operatively coupled with the power supply cable of the printer. The time series of observations plotted in FIGS. 7 and 8 are described further below.

FIG. 7 shows a time series of observations measured for one print job. In FIG. 7, various regions of this time series are labeled, where "active (printing)" corresponds to the active mode (k=0), the portions labeled "ready" and "sleep" correspond to a sequence of two intermediate inactive modes (k=1, . . . , K−1), and the portion labeled "deep sleep" corresponds to the final inactive mode (k=K). In this example, K=3, so there are three inactive modes ("ready", "sleep" and "deep sleep"). A region labeled "recurrent sequence before deep sleep" is also labeled in FIG. 7, which corresponds to some unspecified power draw performed during "sleep" mode. It is treated as noise within that mode, affecting the mean and variance of the power draw in that mode. Had we set K=4, it would have instead been identified as an extra mode in between "sleep" and "deep sleep", which makes sense from a descriptive point of view since it is recurrent and has all the characteristics of a mode, but not from an optimisation standpoint, since the control variables at our disposal for the optimisation relate only to K−1=2 modes ("sleep" and "deep sleep").

FIG. 8 shows a time series of observations measured for three successive print jobs. In FIG. 8, the data for the active mode is labeled "Job1", "Job2", and "Job3" respectively. These three print jobs have overlapping partial shutdown sequences are shown. Additionally, after each of the first two print jobs the sequence of one or more intermediate inactive modes is interrupted by the next print job before reaching the final inactive mode. This is indicated in FIG. 8 by a double-headed arrow, where the double-arrowhead corresponds to a transition back to the active mode, that is, back to k=0. After the last print job (print job "Job3"), no such interruption occurs, and the one or more intermediate inactive modes completes and transition to the final inactive mode (k=K).

A first set of HMM versus QDHMM comparisons were performed on simulated data, in which an experiment consists in repeatedly generating a QDHMM model called the "true" model, then repeatedly drawing some sample data from the true model and comparing the latter to the model estimated from that data by each of the candidate methods (baseline HMM and QDHMM). Two performance measures were considered: the "true error" and the "regret". The true error is the norm of the difference between the vector of power levels $(\mu_k)_{k=0}^K$ in the candidate model and in the true one. This is a useful measure since the vector $(\mu_k)_{k=0}^K$ is a quantity of interest for power consumption optimization. The regret characterizes the predictive capacity of the estimated model: a given proportion of the measurements is randomly selected; then, the predicted consumption over the whole time series given only the selected measurements is computed for the candidate model, and compared to the true value. The overall regret is the root-mean-square error of these predictions. The regret was computed to check whether it relates to the true error (the advantage of the regret being that it does not require the knowledge of the true model). In these simulated data experiments, the performance greatly depends on the true model, and in particular the degree of overlap of the distributions of power level in the active phase and in the different modes of the inactive phase, respectively.

Figure 10:
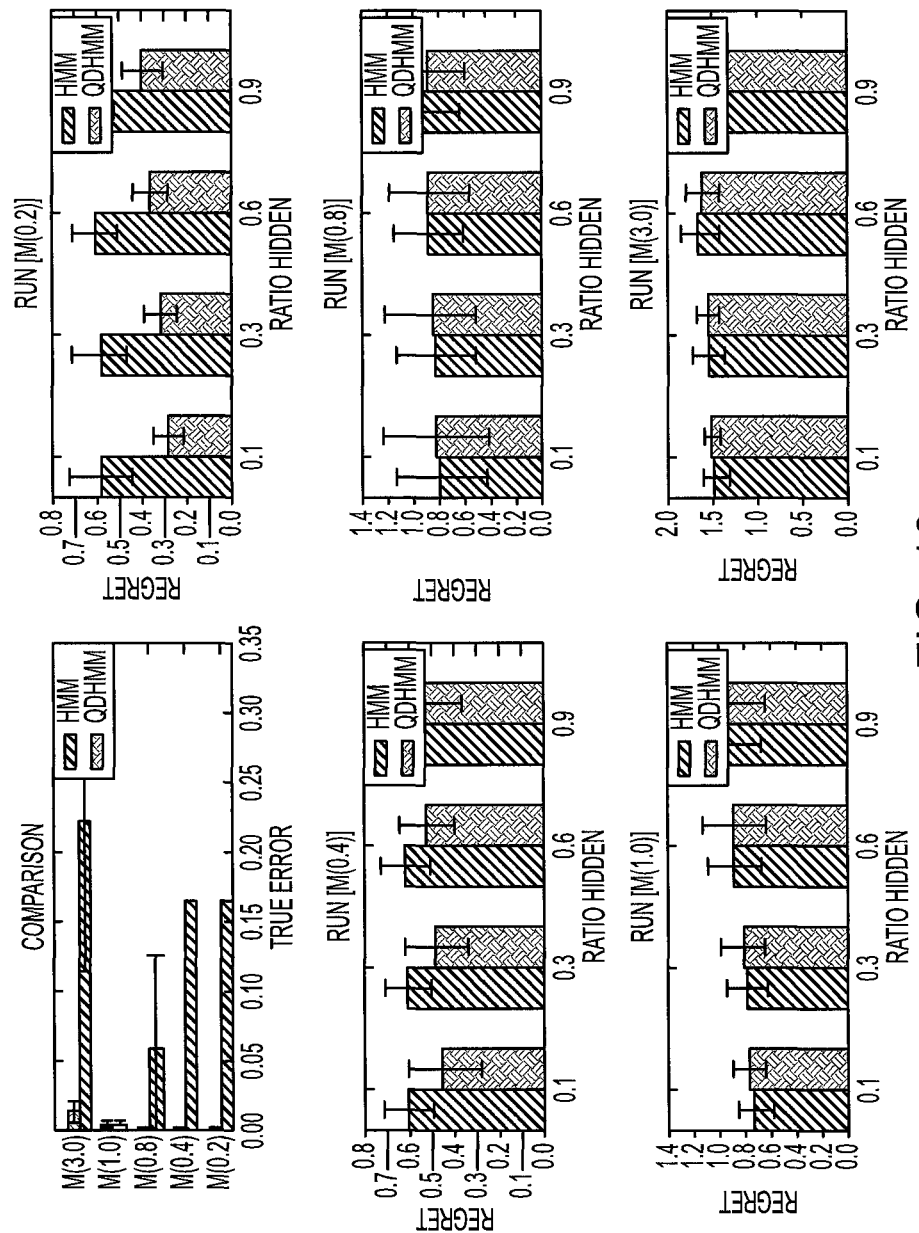
FIG. 10 presents experimental results on simulated data sets as described herein.

With reference to FIG. 10, results are plotted for the simulated data experiments. FIG. 10 compares the two methods (baseline HMM and QDHMM) on five artificially generated "true" models, corresponding to different degrees of overlap of their emission distributions (indicated by a number in parenthesis following the letter "M": higher means more overlap). For both the true error and the regret, lower means better. Based on the results reported in FIG. 10, the regret does not appear to be related to the true error, and so cannot be used in the case of real data to compensate for the absence of a true model in that case. The QDHMM method is seen in FIG. 10 to consistently outperform the baseline HMM. This is not surprising, since the simulated true model was generated using the QDHMM, but it shows that the additional complexity of the QDHMM model as compared with the HMM model does not hamper the learning procedure.

Figure 11:
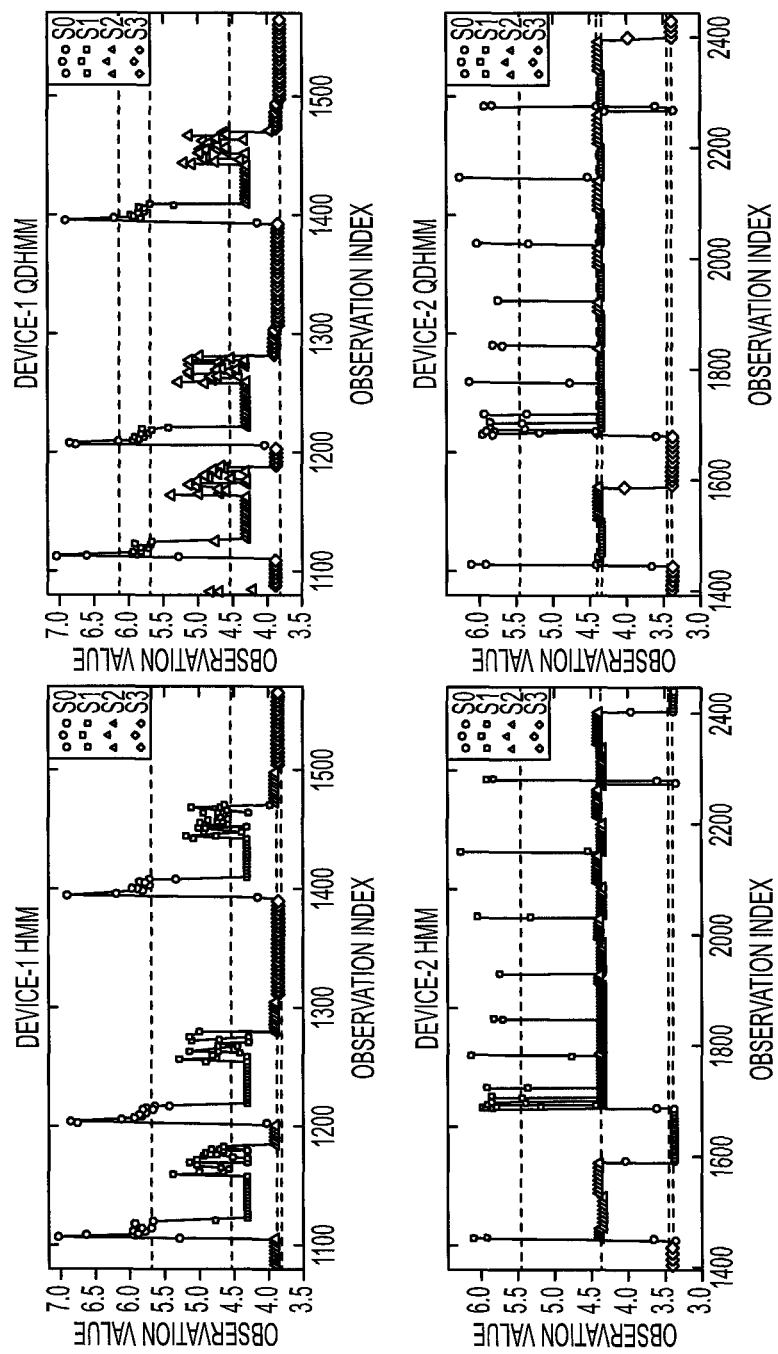
FIG. 11 presents experimental results on real data sets collected from operating printers as described herein.

With reference to FIG. 11, results for real data are presented. Samples of power measurements were collected from two multi-function laser printing devices over a large period of time, while in operation, using a power meter coupled with the printer power cable. After cleaning up the data, a record of approximately 3 weeks and 1 week of measurements, respectively, were obtained for the two devices, at a sampling rate of 1 sample per second. To reduce the size of the data sets, and to account for small noisy variations in the measuring device sampling rate, the raw sampling data were sub-sampled at a rate of 1 sample per 10 seconds, and multiple time series were obtained by segmenting the data into half-day time series blocks. For this real data, there is no known "true" model, so it is not possible to make quantified comparisons in the same way as with simulated data. Instead, various randomly chosen sections of the data were considered, and the predicted states by each candidate model were computed. FIG. 11 presents estimated state (active phase: state 0, inactive phase: state 1-3 corresponding to the different modes) recovered by the two methods (baseline HMM and QDHMM) for the real data from the two multi-function laser printing devices. Using additional logs available for these tests (namely print server logs and, for one of the devices, device MIB states), it was possible to manually reconstruct the true states, i.e. the different activity phases (active/inactive) and modes within the inactive phase. With both devices, compared to the baseline HMM, the results predicted by QDHMM are much closer to the reconstructed true states, and the power levels estimated by the QDHMM model are also much closer to the true power levels. Furthermore, the QDHMM method showed its robustness, as it was able to deal with a recurrent noise pattern in the sleep state of the first device, and with a behavior of the second device in which power consumption was slightly higher in sleep mode than in ready mode.

The QDHMM model disclosed herein is, conceptually, a special case of the general class of Hidden Semi Markov Models (HSMM), in which the state is constrained to change at each step, but can generate a sequence of observations of arbitrary length. Indeed, if each of the (inactive or active) mode is represented by a state, then in QDHMM the length of the observation sequence for each mode follows a "bounded geometric" distribution, i.e. a distribution obtained from a geometric distribution by concentrating all the mass beyond a threshold value onto that value. This makes it possible to map the model into a simple HMM by enlarging the state space, introducing one state per instant spent in each mode instead of one state per mode (except for the two end modes). This in turn means that the well-studied exact inference and learning algorithms for HMM (forward-backward, Viterbi, Baum Welsch) become applicable. The methods disclosed herein show how these generic algorithms are transformed to account for the specific features of the QDHMM model, namely, on the one hand, the constraints on the allowed state transitions of QDHMM, and, on the other hand, the interdependency imposed on the emission models of the different states in QDHMM: when two states belong to the same inactivity mode, they must share their emission model.

It will be appreciated that various of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

The invention claimed is:

1. A system comprising:
a power meter configured to measure power drawn by a device configured to operate in an active mode and to transition through a sequence of inactive modes comprising one or more intermediate inactive modes each having a bounded time duration terminating in a final inactive mode of unbounded time duration wherein the device is further configured to transition from any of the inactive modes to the active mode in response to a device activation signal; and
an electronic data processing device configured to determine statistical characteristics of the power draw of the device in each of the inactive modes by fitting a state model to a time series of observations of the power draw of the device acquired using the power meter, wherein the state model comprises states representing the active mode, the one or more intermediate inactive modes including their respective bounded time durations, and the final inactive mode and wherein the fitting includes estimating power draw parameters of the states representing the active and inactive modes, and the state model further includes a probabilistic representation of the transition from any of the inactive modes to the active mode in response to a device activation signal.

2. The system of claim 1 wherein the state model updates at an update time interval and the probabilistic representation of the transition from any of the inactive modes to the active mode in response to a device activation signal comprises a probability of transition to the active mode per update time interval.

3. The system of claim 1 wherein the state model represents the active mode by an active state and represents each intermediate inactive mode by a Markov sub-chain of states of length effective to represent the bounded time duration of the intermediate inactive mode, the states of the Markov sub-chain of states representing an intermediate inactive mode having the same values for the power draw parameters.

4. The system of claim 3 wherein the fitting further includes estimating the bounded time durations of the intermediate inactive modes by optimizing the lengths of the Markov chains of states representing the intermediate inactive modes.

5. The system of claim 4 wherein the state model includes an upper length limit on the combined lengths of the Markov chains of states representing the intermediate inactive modes, and the estimation of the bounded time durations of the intermediate inactive modes comprises estimating the lengths of the Markov chains of states representing the intermediate inactive modes by computing a cheapest length-K path over the upper length limit.

6. The system of claim 1 wherein the power meter comprises a clamp-on ammeter operatively coupled with an electrical power cord of the device.

7. The system of claim 1 wherein the power meter is configured to measure power drawn by a printer.

8. A non-transitory storage medium storing instructions readable and executable by an electronic data processing device to perform a method operating on a time series of observations of electrical power draw of a device configured to operate in an active mode and to transition through a sequence of inactive modes comprising one or more intermediate inactive modes each having a bounded time duration terminating in a final inactive mode of unbounded time duration wherein the device is further configured to transition from any of the inactive modes to the active mode in response to a device activation signal, the method comprising:

determining statistical characteristics of the power draw of the device in each of the inactive modes by fitting a state model to the time series of observations, wherein the state model comprises a state representing the active mode and a Markov chain of states representing the sequence of inactive modes in which:

the state representing the active mode has a transition to itself and a transition to the first state of the Markov chain of states, each state of the Markov chain except the last state has a transition to the next state of the Markov chain of states and a transition to the active state, and the last state of the Markov chain has a transition to itself and a transition to the active state, and the fitting includes estimating the power draw parameters of the states representing the active and inactive modes to fit the state model to the time series of observations.

9. The non-transitory storage medium of claim 8 wherein:
the transition from the state representing the active mode to itself has a transition probability $\eta$ and
the transition from the state representing the active mode to the first state of the Markov chain of states has a transition probability $1-\eta$ and
the transition from each state of the Markov chain except the last state to the next state of the Markov chain of states has a transition probability $1-\zeta$ and
the transition from the last state of the Markov chain to itself has a transition probability $1-\zeta$ and
the transition from each state of the Markov chain to the active state has a transition probability $\zeta$ and
the fitting further includes estimating $\zeta$ and $\eta$ to fit the state model to the time series of observations.

10. The non-transitory storage medium of claim 8 wherein each intermediate active mode is represented by a sub-chain of the Markov chain of states, the states of the sub-chain having the same power draw parameter values.

11. The non-transitory storage medium of claim 10 wherein the fitting further includes estimating the bounded time durations of the intermediate inactive modes by optimizing allocation of the states of the Markov chain of states to the one or more sub-chains representing the respective one or more intermediate active modes in order to fit the state model to the time series of observations.

12. A system comprising:
a power meter configured to generate a time series of observations of power drawn by a device configured to operate in an active mode and to transition through a sequence of inactive modes comprising one or more intermediate inactive modes each having a bounded time duration terminating in a final inactive mode of unbounded time duration wherein the device is further configured to transition from any of the inactive modes to the active mode in response to a device activation signal; and an electronic data processing device programmed to determine the power draw of the device in each of the inactive modes by fitting a state model to the time series of observations, wherein the state model represents each intermediate inactive mode including its bounded time duration as a Markov chain whose length represents the bounded time duration of the intermediate inactive mode and further includes a probabilistic representation of the transition from any of the inactive modes to the active mode in response to a device activation signal comprising:

a first set of transitions that transition from states representing the inactive modes to a state representing the active mode; and a second set of transitions that transition between states representing the inactive modes;

wherein each transition of the first set of transitions has transition probability $\zeta$ and each transition of the second set of transitions has transition probability $1-\zeta$.

13. The system of claim 12 further comprising:
a printer configured to operate in an active mode and to transition through a sequence of inactive modes comprising one or more intermediate inactive modes each having a bounded time duration terminating in a final inactive mode of unbounded time duration wherein the device is further configured to transition from any of the inactive modes to the active mode in response to a device activation signal;

wherein the power meter is operatively connected to generate a time series of observations of power drawn by the printer.

* * * * *